United States Patent
Tani (10) Patent No.: US 10,171,062 B2
(45) Date of Patent: Jan. 1, 2019

(54) VARIABLE-FREQUENCY FILTER

(71) Applicant: Murata Manufacturing Co., Ltd., Kyoto (JP)

(72) Inventor: Masakazu Tani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 184 days.

(21) Appl. No.: 15/178,113

(22) Filed: Jun. 9, 2016

(65) Prior Publication Data

US 2016/0294357 A1    Oct. 6, 2016

Related U.S. Application Data

(63) Continuation of application No. PCT/JP2014/082620, filed on Dec. 10, 2014.

(30) Foreign Application Priority Data

Dec. 13, 2013   (JP) ................................ 2013-257769

(51) Int. Cl.
*H03H 9/54*    (2006.01)
*H03H 9/64*    (2006.01)
(Continued)

(52) U.S. Cl.
CPC ............ *H03H 9/542* (2013.01); *H03H 9/568* (2013.01); *H03H 9/605* (2013.01); *H03H 9/64* (2013.01);
(Continued)

(58) Field of Classification Search
CPC ........ H03H 9/542; H03H 9/568; H03H 9/605; H03H 9/64; H03H 9/6483; H03H 2210/012; H03H 2210/025
(Continued)

(56) References Cited

U.S. PATENT DOCUMENTS 7,030,718 B1 *   4/2006   Scherer .................. H03J 3/20
                                                        331/117 R
7,135,940 B2    11/2006   Kawakubo
(Continued)

FOREIGN PATENT DOCUMENTS

JP    2004-173245 A    6/2004
JP    2007-036856 A    2/2007
(Continued)

OTHER PUBLICATIONS

International Search Report issued in Application No. PCT/JP2014/082620 dated Mar. 3, 2015.
(Continued)

*Primary Examiner* — Robert J Pascal
*Assistant Examiner* — Jorge Salazar, Jr.
(74) *Attorney, Agent, or Firm* — Pearne & Gordon LLP (57) ABSTRACT

A variable-frequency filter includes a series-arm resonant circuit and a parallel-arm resonant circuit. Each of the series-arm resonant circuit and the parallel-arm resonant circuit includes a piezoelectric resonator, an inductor, and a variable capacitor. A pass band of the variable-frequency filter is formed by a resonant point of the series-arm resonant circuit and a sub-anti-resonant point of the parallel-arm resonant circuit. An attenuation pole at a higher frequency than a pass band is formed by an anti-resonant point of the series-arm resonant circuit and a resonant point of the parallel-arm resonant circuit.

12 Claims, 8 Drawing Sheets

(51) Int. Cl.
*H03H 9/60* (2006.01)
*H03H 9/56* (2006.01)

(52) U.S. Cl.
CPC ..... *H03H 9/6483* (2013.01); *H03H 2210/012* (2013.01); *H03H 2210/025* (2013.01)

(58) Field of Classification Search
USPC .......................... 333/133, 187, 188, 193–196
See application file for complete search history.

(56) References Cited

U.S. PATENT DOCUMENTS

2004/0119561 A1* 6/2004 Omote ................... H03H 9/542
333/133
2012/0313731 A1* 12/2012 Burgener ............... H03H 9/542
333/188

FOREIGN PATENT DOCUMENTS

| JP | 4053504 A | 12/2007 |
| JP | 2009-130831 A | 6/2009 |
| JP | 2010-011300 A | 1/2010 |
| WO | 2012/079038 A2 | 6/2012 |

OTHER PUBLICATIONS

Written Opinion issued in Application No. PCT/JP2014/082620 dated Mar. 3, 2015.

* cited by examiner

PRIOR ART

VARIABLE-FREQUENCY FILTER

BACKGROUND

Technical Field

The present disclosure relates to a variable-frequency filter utilizing a piezoelectric resonator.

To date, various types of high-frequency filter using a piezoelectric resonator having a resonant point and an anti-resonant point have been devised. As such a high-frequency filter having a piezoelectric resonator, various types of variable-frequency filter allowing the filter characteristics to be adjusted have been devised. Note that the filter characteristics refer to, for example, bandpass characteristics, attenuation characteristics, insertion loss, and the like.

The variable-frequency filter disclosed in Patent Document 1 or 2 includes a resonant circuit in which a variable capacitor is connected in series or parallel with a piezoelectric resonator. In Patent Document 1 or 2, a series-arm resonant circuit connected in series between two high-frequency input/output terminals and a parallel-arm resonant circuit connected between the ground and a transmission line connecting the series-arm resonant circuit to the high-frequency input/output terminals are provided.

In the variable-frequency filter disclosed in Patent Document 1 or 2, the pass frequency band and the frequency of the attenuation pole of the variable-frequency filter are set by an appropriate combination of the resonant point and anti-resonant point of the series-arm resonant circuit and the resonant point and anti-resonant point of the parallel-arm resonant circuit.

Figure 10:
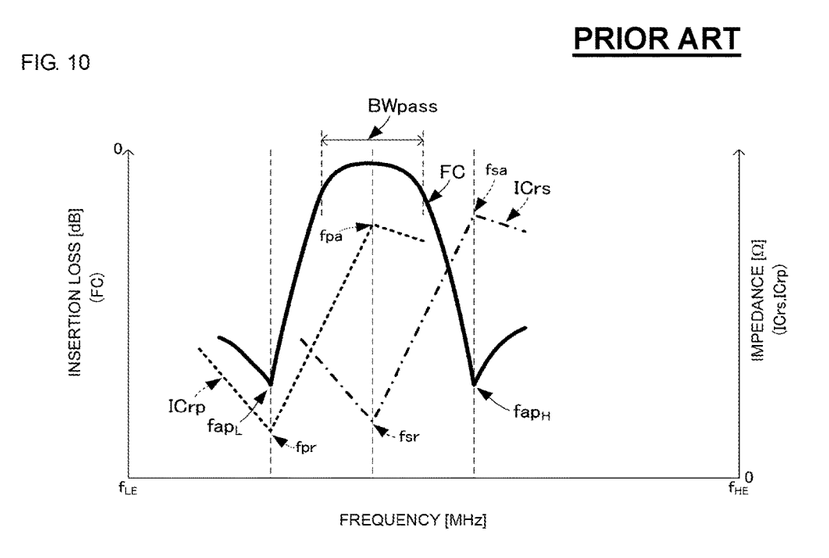
FIG. 10 is a diagram illustrating the principle of setting the pass band and attenuation poles of an existing variable-frequency filter.

FIG. 10 is a diagram illustrating the principle of setting the pass band and attenuation poles of an existing variable-frequency filter. In FIG. 10, the horizontal axis represents frequency and the vertical axes represent insertion loss and impedance. The solid line represents the bandpass characteristics (frequency characteristics of insertion loss) FC of the variable-frequency filter, the broken line represents the impedance characteristics (frequency characteristics of impedance) ICrp of a parallel-arm resonant circuit, and the one-dot chain line represents the impedance characteristics ICrs of a series-arm resonant circuit.

As illustrated in FIG. 10, since piezoelectric resonators are used, a resonant point fsr of the series-arm resonant circuit is lower than an anti-resonant point fsa thereof, and a resonant point fpr of the parallel-arm resonant circuit is lower than an anti-resonant point fpa.

In the series-arm resonant circuit, a transmission loss between the two high-frequency input/output terminals is low near the resonant point fsr, and the transmission loss between the two high-frequency input/output terminals is high near the anti-resonant point fsa. On the other hand, in the parallel-arm resonant circuit, the transmission loss between the two high-frequency input/output terminals is high near the resonant point fpr, and the transmission loss between the two high-frequency input/output terminals is low near the anti-resonant point fpa.

By utilizing these characteristics, a pass band BWpass of the variable-frequency filter is formed by making the resonant point fsr of the series-arm resonant circuit and the anti-resonant point fpa of the parallel-arm resonant circuit be the same or close to each other. An attenuation pole $fap_H$ at a higher frequency than the pass band BWpass of the variable-frequency filter is formed by the anti-resonant point fsa of the series-arm resonant circuit. Further, an attenuation pole $fap_L$ at a lower frequency than the pass band BWpass of the variable-frequency filter is formed by the resonant point fpr of the parallel-arm resonant circuit.

Here, the resonant point fsr and the anti-resonant point fsa of the series-arm resonant circuit and the resonant point fpr and the anti-resonant point fpa of the parallel-arm resonant circuit can be adjusted by changing the capacitances of variable capacitors connected in series or in parallel with piezoelectric resonators of the series-arm resonant circuit and the parallel-arm resonant circuit. Hence, in the existing variable-frequency filter, the pass band BWpass and the attenuation poles $fap_H$, $fap_H$ of the variable-frequency filter are adjusted by changing the capacitances of the variable capacitors of the series-arm resonant circuit and the parallel-arm resonant circuit.

Patent Document 1: Japanese Unexamined Patent Application Publication No. 2009-130831

Patent Document 2: Japanese Patent No. 4053504

BRIEF SUMMARY

However, in the variable-frequency filter having the circuit configuration described above, the frequency variable width is approximately the same as the width over which the resonant points and the anti-resonant points of the series-arm resonant circuit and parallel-arm resonant circuit can be varied. Hence, if the frequency variable width in the variable-frequency filter is to be increased, the capacitance variable width of a variable capacitor needs to be increased.

The Q factor of a variable capacitor is lower than the Q factor of the piezoelectric resonator, and the larger the capacitance variable width, the more the Q factor is degraded. Hence, the bandpass characteristics and attenuation characteristics of a variable frequency filter are degraded compared with a filter using only piezoelectric resonators. Specifically, the wider the frequency variable width, the more the bandpass characteristics and attenuation characteristics are degraded.

The present disclosure provides a variable-frequency filter that allows degradation of the bandpass characteristics and attenuation characteristics to be suppressed.

A variable-frequency filter of the present disclosure has the following configuration. A series-arm resonant circuit and a parallel-arm resonant circuit are provided. The series-arm resonant circuit is connected between a first input/output terminal and a second input/output terminal. The parallel-arm resonant circuit is connected between a ground and a transmission line connecting one of the first input/output terminal and the second input/output terminal to the series-arm resonant circuit. The variable-frequency filter is a filter allowing a pass band and an attenuation range to be adjusted. Each of the series-arm resonant circuit and the parallel-arm resonant circuit includes a piezoelectric resonator, an inductor connected in series or parallel with the piezoelectric resonator, and a variable capacitor connected in series or parallel with the piezoelectric resonator. In the variable-frequency filter, the pass band or attenuation range is adjusted by using at least one of a sub-resonant point or a sub-anti-resonant point of the series-arm resonant circuit, or at least one of a sub-resonant point or a sub-anti-resonant point of the parallel-arm resonant circuit, for at least one communication band among a plurality of communication bands subjected to filter processing performed by the variable-frequency filter.

With this configuration, not only the resonant point and the anti-resonant point but also the sub-resonant point appearing at a higher frequency than the anti-resonant point or a sub-anti-resonant point appearing at a lower frequency than the resonant point can be utilized for setting the pass band and the attenuation ranges. Hence, even when the frequency variable widths of the resonant point and the anti-resonant point are narrowed, the pass band and the attenuation ranges can be set for a plurality of communication bands subjected to filter processing performed by the variable-frequency filter. Since the frequency variable widths of the resonant point and the anti-resonant point are narrowed, the Q factors of the resonant circuits are improved and the bandpass characteristics and the attenuation characteristics are enhanced.

The variable-frequency filter of the present disclosure may have the following configuration. The parallel-arm resonant circuit of this variable-frequency filter includes the inductor connected in parallel with the piezoelectric resonator of the parallel-arm resonant circuit, and generates a sub-anti-resonant point at a lower frequency than a resonant point of the parallel-arm resonant circuit, and the pass band of the variable-frequency filter is set by using this sub-anti-resonant point.

As a more specific aspect, the following configuration is optional.

In the variable-frequency filter, the pass band is set by making the sub-anti-resonant point of the parallel-arm resonant circuit and a resonant point of the series-arm resonant circuit be close to each other. In the variable-frequency filter, the attenuation range at higher frequencies than the pass band is set by making an anti-resonant point of the series-arm resonant circuit and the resonant point of the parallel-arm resonant circuit be close to each other.

With this configuration, by using the sub-anti-resonant point of the parallel-arm resonant circuit, the frequency variable width of the pass band can be increased even when the frequency variable width of the anti-resonant point of the parallel-arm resonant circuit is small.

The variable-frequency filter of the present disclosure may have the following configuration. The series-arm resonant circuit of the variable-frequency filter includes the inductor connected in series with the piezoelectric resonator of the series-arm resonant circuit and generates sub-resonance at a higher frequency than an anti-resonant point of the series-arm resonant circuit. The pass band is set by using this sub-resonant point.

As a more specific aspect, the following configuration is optional.

In the variable-frequency filter, the pass band is set by making the sub-resonant point of the series-arm resonant circuit and the anti-resonant point of the parallel-arm resonant circuit be close to each other. In the variable-frequency filter, the attenuation range at lower frequencies than the pass band is set by making the anti-resonant point of the series-arm resonant circuit and a resonant point of the parallel-arm resonant circuit be close to each other.

With this configuration, by using the sub-resonant point of the series-arm resonant circuit, the frequency variable width of the pass band can be increased even when the frequency variable width of the resonant point of the series-arm resonant circuit is small.

The variable-frequency filter of the present disclosure may have the following configuration. The series-arm resonant circuit of this variable-frequency filter includes the inductor connected in parallel with the piezoelectric resonator of the series-arm resonant circuit and generates a sub-anti-resonant point at a lower frequency than a resonant point of the series-arm resonant circuit, and the attenuation range is set by using this sub-anti-resonant point.

As a more specific aspect, the following configuration is preferable.

In the variable-frequency filter, the pass band is set by making the resonant point of the series-arm resonant circuit and the anti-resonant point of the parallel-arm resonant circuit be close to each other. In the variable-frequency filter, the attenuation range at lower frequencies than the pass band is set by making the sub-anti-resonant point of the series-arm resonant circuit and a resonant point of the parallel-arm resonant circuit be close to each other.

With this configuration, by using the sub-anti-resonant point of the series-arm resonant circuit, the frequency variable width of the attenuation range can be increased even when the frequency variable width of the anti-resonant point of the series-arm resonant circuit is small.

The variable-frequency filter of the present disclosure may have the following configuration. The parallel-arm resonant circuit of this variable-frequency filter includes the inductor connected in series with the piezoelectric resonator of the parallel-arm resonant circuit, and generates sub-resonance at a higher frequency than an anti-resonant point of the parallel-arm resonant circuit. The attenuation range is set by using this sub-resonant point.

As a more specific aspect, the following configuration is optional.

In the variable-frequency filter, the pass band is set by making a resonant point of the series-arm resonant circuit and the anti-resonant point of the parallel-arm resonant circuit be close to each other. The attenuation range at higher frequencies than the pass band is set by using the sub-resonant point of the parallel-arm resonant circuit.

With this configuration, by using the sub-resonant point of the parallel-arm resonant circuit, the frequency variable width of an attenuation range can be increased even when the frequency variable width of the resonant point of the parallel-arm resonant circuit is small.

In any of the aspects described above, the variable range of the pass band can be increased without necessarily increasing the capacitance variable range of the variable capacitor of the series-arm resonant circuit or parallel-arm resonant circuit.

According to the present disclosure, a variable-frequency filter having excellent bandpass characteristics and attenuation characteristics can be realized.

DETAILED DESCRIPTION

Figure 1:
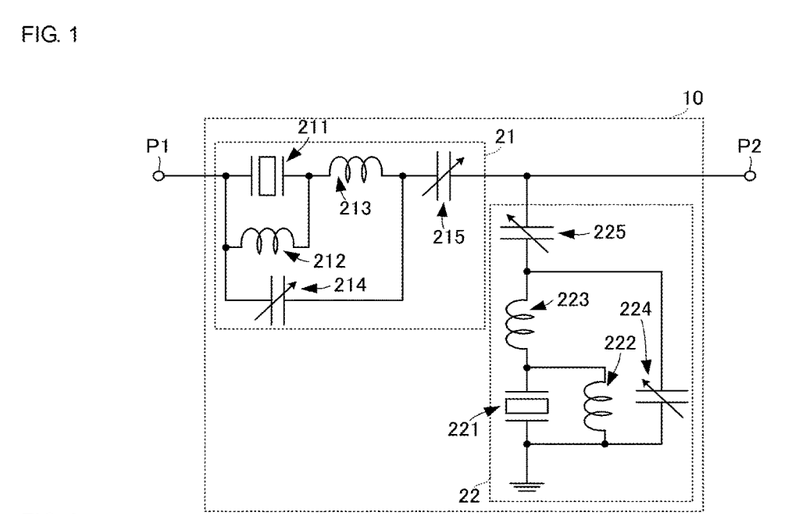
FIG. 1 is a circuit diagram of a variable-frequency filter according to an embodiment of the present disclosure.

A variable-frequency filter according to an embodiment of the present disclosure will be described with reference to the drawings. FIG. 1 is a circuit diagram of a variable-frequency filter according to an embodiment of the present disclosure.

Referring to FIG. 1, a variable-frequency filter 10 includes a series-arm resonant circuit 21 and a parallel-arm resonant circuit 22.

The series-arm resonant circuit 21 is connected between a first input/output terminal P1 and a second input/output terminal P2. In other words, the series-arm resonant circuit 21 is connected in series with a transmission line of a high-frequency signal. The parallel-arm resonant circuit 22 is connected between the ground and a transmission line connecting the series-arm resonant circuit 21 and the second input/output terminal P2 to each other. In other words, the parallel-arm resonant circuit 22 is connected as a shunt to the transmission line.

The series-arm resonant circuit 21 includes a piezoelectric resonator 211, inductors 212 and 213, and variable capacitors 214 and 215. The piezoelectric resonator 211, the inductor 213, and the variable capacitor 215 are connected in series between the first input/output terminal P1 and the second input/output terminal P2. At this time, the piezoelectric resonator 211, the inductor 213, and the variable capacitor 215 are connected in this order from the first input/output terminal P1 side. The inductor 212 is connected in parallel with the piezoelectric resonator 211. The variable capacitor 214 is connected in parallel with the series circuit of the piezoelectric resonator 211 and the inductor 213.

The parallel-arm resonant circuit 22 includes a piezoelectric resonator 221, inductors 222 and 223, and variable capacitors 224 and 225. The piezoelectric resonator 221, the inductor 223, and the variable capacitor 225 are connected in series between the transmission line and the ground. At this time, the piezoelectric resonator 221, the inductor 223, and the variable capacitor 225 are connected in this order from the ground side. The inductor 222 is connected in parallel with the piezoelectric resonator 221. The variable capacitor 224 is connected in parallel with the series circuit of the piezoelectric resonator 221 and the inductor 223.

The piezoelectric resonators 211 and 221 are realized by SAW resonators or BAW resonators. For example, the SAW resonator is realized by forming comb-shaped electrodes on the surface of a lithium niobate substrate cut in a specific direction (for example, Y-cut).

The inductors 212, 213, 222, and 223 are realized by, for example, electrode patterns formed on the mounting substrate for mounting the piezoelectric resonators 211 and 221, or chip components mounted on the surface of the mounting substrate. The variable capacitors 214, 215, 224, and 225 are realized by chip components mounted on the surface of the mounting substrate for mounting, for example, the piezoelectric resonators 211 and 221.

In the series-arm resonant circuit 21, the inductors 212 and 213 are called extension inductors. By providing the inductor 212, the frequency of the anti-resonant point of the circuit formed of the piezoelectric resonator 211 and the inductor 212 becomes higher than the frequency of the anti-resonant point of the piezoelectric resonator 211. By providing the inductor 213, the frequency of the resonant point of a circuit formed of the piezoelectric resonator 211, the inductor 212, and the inductor 213 becomes lower than the frequency of the resonant point of the circuit formed of the piezoelectric resonator 211 and the inductor 212. By providing the inductors 212 and 213 described above, the frequency-variable ranges of the resonant point and the anti-resonant point can be increased.

In the series-arm resonant circuit 21, by providing the variable capacitor 214, the frequency of the anti-resonant point of the circuit formed of the piezoelectric resonator 211, the inductors 212 and 213, and the variable capacitor 214 becomes lower than the frequency of the anti-resonant point of the circuit formed of the piezoelectric resonator 211 and the inductors 212 and 213 and becomes higher than the frequency of the resonant point of the circuit formed of the piezoelectric resonator 211 and the inductors 212 and 213. At this time, the frequency of the resonant point can be adjusted within this frequency range by changing the capacitance of the variable capacitor 214. In other words, the frequency fsa of the anti-resonant point of the series-arm resonant circuit 21 can be adjusted.

In the series-arm resonant circuit 21, by providing the variable capacitor 215, the frequency of the anti-resonant point of the circuit, i.e., the series-arm resonant circuit 21, formed of the piezoelectric resonator 211, the inductors 212 and 213, and the variable capacitors 214 and 215 becomes higher than the frequency of the resonant point of the circuit formed of the piezoelectric resonator 211, the inductors 212 and 213, and the variable capacitor 214, and becomes lower than the frequency of the anti-resonant point of the circuit formed of the piezoelectric resonator 211, the inductors 212 and 213, and the variable capacitor 214. At this time, by changing the capacitance of the variable capacitor 215, the frequency of the resonant point can be adjusted within this frequency range.

Further, in the series-arm resonant circuit 21, by providing the inductors 212 and 213 together with the piezoelectric resonator 211, a sub-resonant point $fsr_{CO}$ and a sub-anti-resonant point $fsa_{CO}$ appear. The sub-resonant point $fsr_{CO}$ closest to the anti-resonant point fsa of the series-arm resonant circuit 21 appears at a higher frequency than the anti-resonant point fsa. The sub-anti-resonant point $fsa_{CO}$ closest to the resonant point fsr and the anti-resonant point fsa of the series-arm resonant circuit 21 appears at a lower frequency than the resonant point fsr.

In the parallel-arm resonant circuit 22, the inductors 222 and 223 are called extension inductors. By providing the inductor 222, the frequency of the anti-resonant point of the circuit formed of the piezoelectric resonator 221 and the inductor 222 becomes higher than the frequency of the anti-resonant point of the piezoelectric resonator 221. By providing the inductor 223, the frequency of the resonant point of the circuit formed of the piezoelectric resonator 221, the inductor 222, and the inductor 223 becomes lower than the frequency of the resonant point of the circuit formed of the piezoelectric resonator 221 and the inductor 222. By providing the inductors 222 and 223 described above, the frequency-variable ranges of the resonant point and the anti-resonant point can be increased.

In the parallel-arm resonant circuit 22, by providing the variable capacitor 224, the frequency of the anti-resonant point of the circuit formed of the piezoelectric resonator 221, the inductors 222 and 223, and the variable capacitor 224 becomes lower than the frequency of the anti-resonant point of the circuit formed of the piezoelectric resonator 221 and the inductors 222 and 223 and becomes higher than the frequency of the resonant point of the circuit formed of the piezoelectric resonator 221 and the inductors 222 and 223. At this time, the anti-resonant point can be adjusted within this frequency range by changing the capacitance of the variable capacitor 224. In other words, the anti-resonant point fpa of the parallel-arm resonant circuit 22 can be adjusted.

In the parallel-arm resonant circuit 22, by providing the variable capacitor 225, the frequency of the resonant point of the circuit, i.e., the parallel-arm resonant circuit 22, formed of the piezoelectric resonator 221, the inductors 222 and 223, and the variable capacitors 224 and 225 becomes higher than the frequency of the resonant point of the circuit formed of the piezoelectric resonator 221, the inductors 222 and 223, and the variable capacitor 224, and becomes lower than the frequency of the anti-resonant point of the circuit formed of the piezoelectric resonator 221, the inductors 222 and 223, and the variable capacitor 224. At this time, by changing the capacitance of the variable capacitor 225, the frequency fpr of the resonant point can be adjusted within this frequency range.

Further, in the parallel-arm resonant circuit 22, a sub-resonant point $fpr_{CO}$ and a sub-anti-resonant point $fpa_{CO}$ appear by providing the inductors 222 and 223 together with the piezoelectric resonator 221. The sub-resonant point $fpr_{CO}$ closest to the resonant point fpr and anti-resonant point fpa of the parallel-arm resonant circuit 22 appears at a higher frequency than the anti-resonant point fpa. The sub-anti-resonant point $fpa_{CO}$ closest to the resonant point fpr and anti-resonant point fpa of the parallel-arm resonant circuit 22 appears at a lower frequency than the resonant point fpr.

In the variable-frequency filter 10 of the present embodiment, the filter characteristics are set by utilizing at least one of the sub-resonant point $fsr_{CO}$ of the series-arm resonant circuit 21, the sub-anti-resonant point $fsa_{CO}$ of the series-arm resonant circuit 21, the sub-resonant point $fpr_{CO}$ of the parallel-arm resonant circuit 22, or the sub-anti-resonant point $fpa_{CO}$ of the parallel-arm resonant circuit 22. At this time, the sub-resonant point $fsr_{CO}$ of the series-arm resonant circuit 21 and the sub-anti-resonant point $fpa_{CO}$ of the parallel-arm resonant circuit 22 are used to set the pass band, and the sub-anti-resonant point $fsa_{CO}$ of the series-arm resonant circuit 21 and the sub-resonant point $fpr_{CO}$ of the parallel-arm resonant circuit 22 are used to set the attenuation ranges.

The frequencies of the sub-resonant points $fsr_{CO}$ and $fpr_{CO}$ can be shifted similarly to the resonant points fsr and fpr by using the capacitances of variable capacitors. The sub-resonant points $fsr_{CO}$ and $fpr_{CO}$ respectively appear at higher frequencies than the anti-resonant points fsa and fpa so as to be respectively opposite the resonant points fsr and fpr.

Similarly, the frequencies of the sub-anti-resonant points $fsa_{CO}$ and $fpa_{CO}$ can be shifted similarly to the anti-resonant points fsa and fpa by using the capacitances of variable capacitors. The sub-anti-resonant points $fsa_{CO}$ and $fpa_{CO}$ respectively appear at lower frequencies than the resonant points fsr and fpr so as to be respectively opposite the anti-resonant points fsa and fpa.

Hence, by utilizing at least one of the sub-resonant point $fsr_{CO}$ of the series-arm resonant circuit 21, the sub-anti-resonant point $fsa_{CO}$ of the series-arm resonant circuit 21, the sub-resonant point $fpr_{CO}$ of the parallel-arm resonant circuit 22, or the sub-anti-resonant point $fpa_{CO}$ of the parallel-arm resonant circuit 22, the filter characteristics can be varied in a wider frequency range than in the case where setting is performed by using only the resonant points fsr and fpr and the anti-resonant points fsa and fpa.

In other words, an existing plurality of communication bands supported by varying only the resonant points fsr and fpr and the anti-resonant points fsa and fpa can also be supported without necessarily increasing the frequency-variable ranges of the resonant points fsr and fpr and the anti-resonant points fsa and fpa as in the existing configuration. As a result, the capacitance variable ranges of variable capacitors can be decreased, the Q factors of the series-arm resonant circuit 21 and the parallel-arm resonant circuit 22 can be improved, and the bandpass characteristics and attenuation characteristics of the variable-frequency filter 10 can be enhanced.

Next, specific setting modes will be described with reference to the drawings. Note that in each of the characteristics diagrams below describing the setting modes, the horizontal axis represents frequency and the vertical axes represent insertion loss and impedance. A solid line represents the bandpass characteristics (frequency characteristics of insertion loss) FC of the variable-frequency filter, a broken line represents the impedance characteristics (frequency characteristics of impedance) ICrp of the parallel-arm resonant circuit, and a one-dot chain line represents the impedance characteristics ICrs of the series-arm resonant circuit. Here, fsr denotes the resonant point (resonant frequency) of the series-arm resonant circuit, fsa denotes the anti-resonant point (anti-resonant frequency) of the series-arm resonant circuit, fpr denotes the resonant point (resonant frequency) of the parallel-arm resonant circuit, and fpa denotes the anti-resonant point (anti-resonant frequency) of the parallel-arm resonant circuit. Further, $fsr_{CO}$ denotes the sub-resonant point (sub-resonant frequency) of the series-arm resonant circuit, $fsa_{CO}$ denotes the sub-anti-resonant point (sub-anti-resonant frequency) of the series-arm resonant circuit. Further, $fpr_{CO}$ denotes the sub-resonant point (sub-resonant frequency) of the parallel-arm resonant circuit, and $fpa_{CO}$ denotes the sub-anti-resonant point (sub-anti-resonant frequency) of the parallel-arm resonant circuit.

(First Setting Mode)

Figure 2:
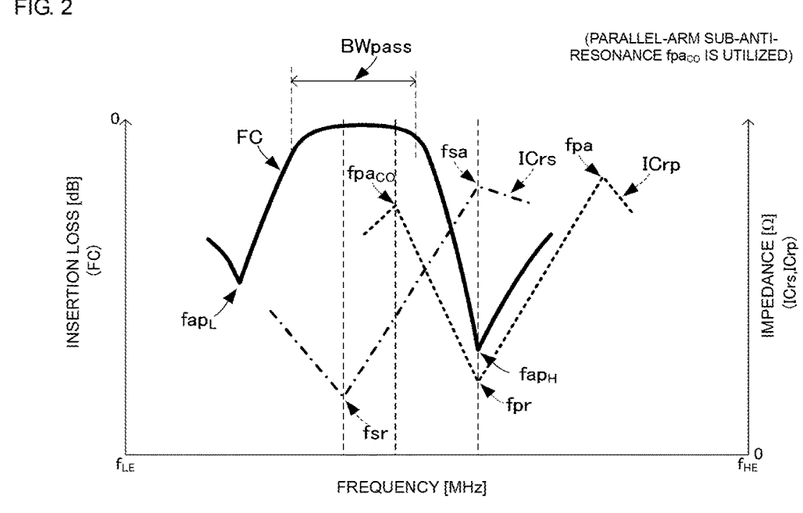
FIG. 2 is a characteristics diagram of insertion loss and impedance for describing a first setting mode of the variable-frequency filter according to an embodiment of the present disclosure.

FIG. 2 is the characteristics diagram of insertion loss and impedance for describing a first setting mode of the variable-frequency filter according to an embodiment of the present disclosure.

In the first setting mode, the sub-anti-resonant point $fpa_{CO}$ of the parallel-arm resonant circuit 22 is utilized.

Referring to FIG. 2, the resonant point fsr of the series-arm resonant circuit 21 and the sub-anti-resonant point $fpa_{CO}$ of the parallel-arm resonant circuit 22 are made to be close to each other with a predetermined frequency width therebetween. As a result, the pass band BWpass of the variable-frequency filter 10 is formed. Further, the frequency of the resonant point fpr of the parallel-arm resonant circuit 22 and the frequency of the anti-resonant point fsa of the series-arm resonant circuit 21 are made to be about the same, the same, or substantially similar. Thus, the frequency of the resonant point fpr of the parallel-arm resonant circuit 22 and the frequency of the anti-resonant point fsa of the series-arm resonant circuit 21 are closer to each other than the frequency of the resonant point fsr of the series-arm resonant circuit 21 and the frequency of the sub-anti-resonant point $fpa_{CO}$ of the parallel-arm resonant circuit 22. As a result, the attenuation pole $fap_H$ at a higher frequency than the pass band BWpass is formed.

The pass band BWpass and the frequency of the attenuation pole $fap_H$, that is, the bandpass characteristics FC of the variable-frequency filter can be adjusted by adjusting the variable capacitors of the series-arm resonant circuit 21 and the parallel-arm resonant circuit 22, while maintaining the above-described state in which the resonant point fsr of the series-arm resonant circuit 21 and the sub-anti-resonant point $fpa_{CO}$ of the parallel-arm resonant circuit 22 are made to be close to each other and maintaining the state in which the resonant point fpr of the parallel-arm resonant circuit 22 and the anti-resonant point fsa of the series-arm resonant circuit 21 are made to be about the same, the same, or substantially similar.

By using the configuration described above, the attenuation characteristics at higher frequencies than the pass band BWpass can be made to be particularly steep.

Note that the attenuation pole $fap_L$ at a lower frequency than the pass band BWpass can be formed by using, for example, the sub-anti-resonant point (not illustrated) of the series-arm resonant circuit 21 or the resonant point (not illustrated) of the parallel-arm resonant circuit 22.

(Second Setting Mode)

Figure 3:
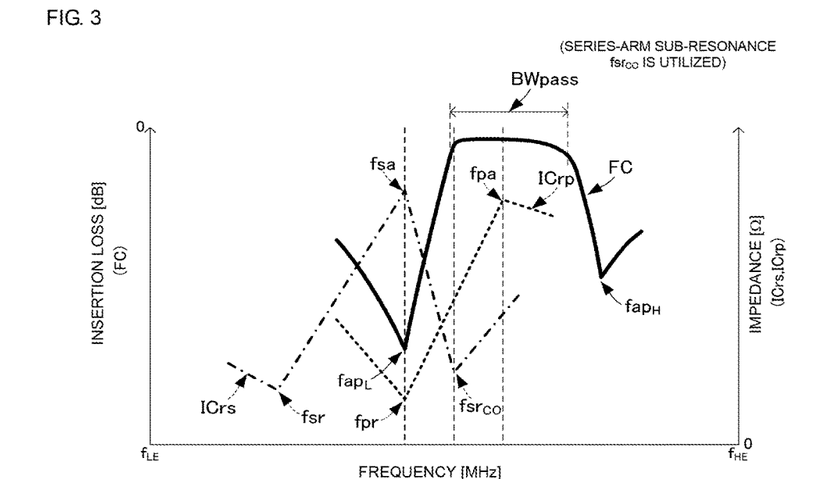
FIG. 3 is a characteristics diagram of insertion loss and impedance for describing a second setting mode of the variable-frequency filter according to an embodiment of the present disclosure.

FIG. 3 is the characteristics diagram of insertion loss and impedance for describing a second setting mode of the variable-frequency filter according to an embodiment of the present disclosure.

In the second setting mode, the sub-resonant point $fsr_{CO}$ of the series-arm resonant circuit 21 is utilized.

Referring to FIG. 3, the sub-resonant point $fsr_{CO}$ of the series-arm resonant circuit 21 and the anti-resonant point fpa of the parallel-arm resonant circuit 22 are made to be close to each other with a predetermined frequency width therebetween. As a result, the pass band BWpass of the variable-frequency filter 10 is formed. Further, the frequency of the resonant point fpr of the parallel-arm resonant circuit 22 and the frequency of the anti-resonant point fsa of the series-arm resonant circuit 21 are made to be about the same, the same, or substantially similar. Thus, the frequency of the resonant point fpr of the parallel-arm resonant circuit 22 and the frequency of the anti-resonant point fsa of the series-arm resonant circuit 21 are closer to each other than the frequency of the sub-resonant point $fsr_{CO}$ of the series-arm resonant circuit 21 and the frequency of the anti-resonant point fpa of the parallel-arm resonant circuit 22. As a result, the attenuation pole $fap_L$ at a lower frequency than the pass band BWpass is formed.

The pass band BWpass and attenuation pole $fap_L$, that is, the bandpass characteristics FC of the variable-frequency filter can be adjusted by adjusting the variable capacitors of the series-arm resonant circuit 21 and the parallel-arm resonant circuit 22, while maintaining the above-described state in which the sub-resonant point $fsr_{CO}$ of the series-arm resonant circuit 21 and the anti-resonant point fpa of the parallel-arm resonant circuit 22 are made to be close to each other and maintaining the state in which the resonant point fpr of the parallel-arm resonant circuit 22 and the anti-resonant point fsa of the series-arm resonant circuit 21 are made to be about the same, the same, or substantially similar.

By using the configuration described above, the attenuation characteristics at lower frequencies than the pass band BWpass can be made to be particularly steep.

Note that the attenuation pole $fap_H$ at a higher frequency than the pass band BWpass can be formed by using, for example, the sub-resonant point (not illustrated) of the parallel-arm resonant circuit 22.

(Third Setting Mode)

Figure 4:
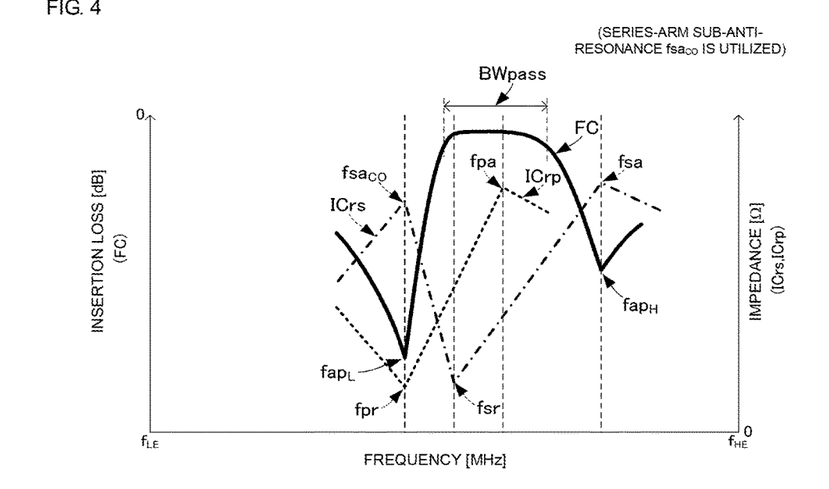
FIG. 4 is a characteristics diagram of insertion loss and impedance for describing a third setting mode of the variable-frequency filter according to an embodiment of the present disclosure.

FIG. 4 is the characteristics diagram of insertion loss and impedance for describing a third setting mode of the variable-frequency filter according to an embodiment of the present disclosure.

In the third setting mode, the sub-anti-resonant point $fsa_{CO}$ of the series-arm resonant circuit 21 is utilized.

Referring to FIG. 4, the resonant point fsr of the series-arm resonant circuit 21 and the anti-resonant point fpa of the parallel-arm resonant circuit 22 are made to be close to each other with a predetermined frequency width therebetween. As a result, the pass band BWpass of the variable-frequency filter 10 is formed. Further, the resonant point fpr of the parallel-arm resonant circuit 22 and the sub-anti-resonant point $fsa_{CO}$ of the series-arm resonant circuit 21 are made to be about the same, the same, or substantially similar. Thus, the frequency of a resonant point of the parallel-arm resonant circuit and the sub-anti-resonant point of the series-arm resonant circuit are closer to each other than the frequency of the resonant point of the series-arm resonant circuit and the frequency of the anti-resonant point of the parallel-arm resonant circuit. As a result, the attenuation pole $fap_L$ at a lower frequency than the pass band BWpass is formed.

Further, the attenuation pole $fap_H$ at a higher frequency than the pass band BWpass is formed by the anti-resonant point fsa of the series-arm resonant circuit 21.

The pass band BWpass and the frequencies of the attenuation poles $fap_L$ and $fap_H$, that is, the bandpass characteristics FC of the variable-frequency filter can be adjusted by adjusting the variable capacitors of the series-arm resonant circuit 21 and the parallel-arm resonant circuit 22, while maintaining the state in which the resonant point fsr of the series-arm resonant circuit 21 and the anti-resonant point fpa of the parallel-arm resonant circuit 22 are made to be close to each other and maintaining the state in which the resonant point fpr of the parallel-arm resonant circuit 22 and the sub-anti-resonant point $fsa_{CO}$ of the series-arm resonant circuit 21 are made to be about the same, the same, or substantially similar.

By using the configuration described above, the attenuation characteristics at lower frequencies than the pass band BWpass can be made to be particularly steep.

(Fourth Setting Mode)

Figure 5:
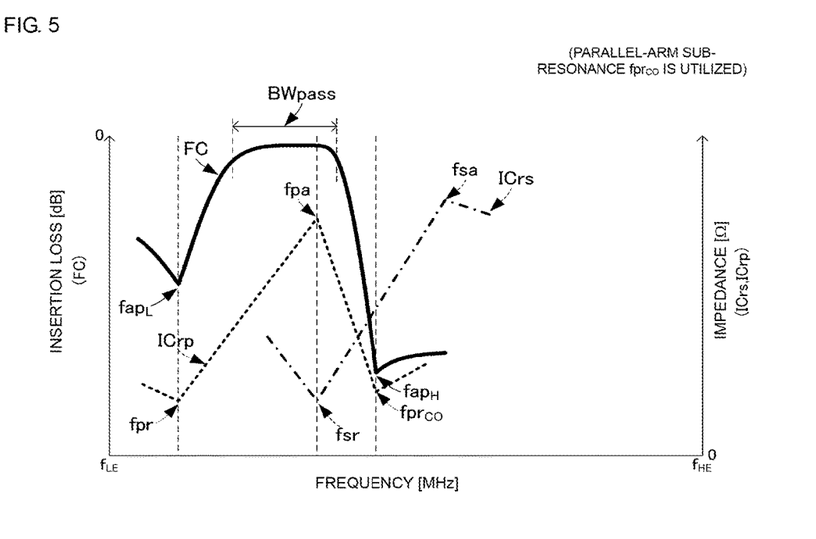
FIG. 5 is a characteristics diagram of insertion loss and impedance for describing a fourth setting mode of the variable-frequency filter according to an embodiment of the present disclosure.

FIG. 5 is the characteristics diagram of insertion loss and impedance for describing a fourth setting mode of the variable-frequency filter according to an embodiment of the present disclosure.

In the fourth setting mode, the sub-resonant point $fpr_{CO}$ of the parallel-arm resonant circuit 22 is utilized.

Referring to FIG. 5, the resonant point fsr of the series-arm resonant circuit 21 and the anti-resonant point fpa of the parallel-arm resonant circuit 22 are made to be close to each other or about the same, the same, or substantially similar. As a result, the pass band BWpass of the variable-frequency filter 10 is formed. By using the mode of making the two points be about the same, the same, or substantially similar, the width of the pass band BWpass can be narrowed and, further, the insertion loss can be reduced. Further, the attenuation pole $fap_H$ at a higher frequency than the pass band BWpass is formed by the sub-resonant point $fpr_{CO}$ of the parallel-arm resonant circuit 22.

Further, by using the resonant point fpr of the parallel-arm resonant circuit 22, the attenuation pole fapL at a lower frequency than the pass band BWpass is formed.

The pass band BWpass and the frequencies of the attenuation poles $fap_L$ and $fap_H$, that is, the bandpass characteristics FC of the variable-frequency filter can be adjusted by adjusting the variable capacitors of the series-arm resonant circuit 21 and the parallel-arm resonant circuit 22, while maintaining the state in which the resonant point fsr of the series-arm resonant circuit 21 and the anti-resonant point fpa of the parallel-arm resonant circuit 22 are made to be close to each other or about the same, the same, or substantially similar.

Next, specific examples of characteristics setting in the case of being utilized for a plurality of communication bands will be described. Note that in each of the characteristics diagrams describing the specific examples of characteristics setting, the horizontal axis represents frequency and the vertical axis represents insertion loss or impedance. A solid line represents the characteristics in the case where first filter processing corresponding to a first communication band is performed, a broken line represents the characteristics in the case where second filter processing corresponding to a second communication band is performed, and a one-dot chain line represents the characteristics in the case where third filter processing corresponding to a third communication band is performed. Further in each figure, (A) denotes the insertion loss characteristics (bandpass characteristics) of the variable-frequency filter, (B) denotes the impedance characteristics of the series-arm resonant circuit, and (C) denotes the impedance characteristics of the parallel-arm resonant circuit.

FIRST EXAMPLE

Figure 6A:
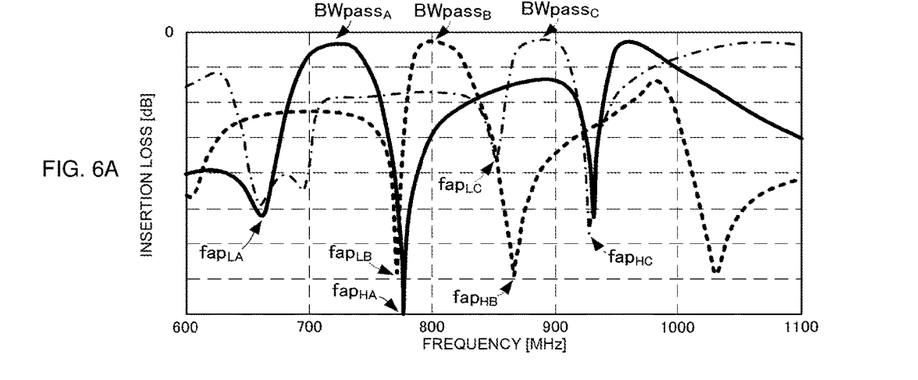
FIGS. 6A-6C are characteristics diagrams of insertion loss and impedance in a first specific example in the case of being utilized for a plurality of communication bands.
Figure 6B:
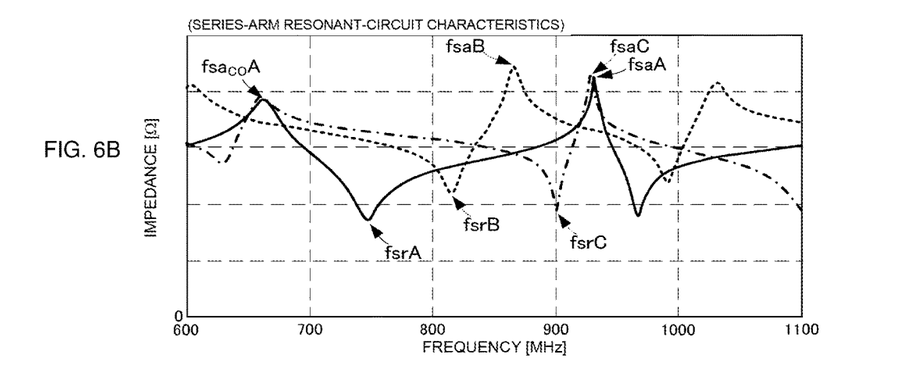
Figure 6C:
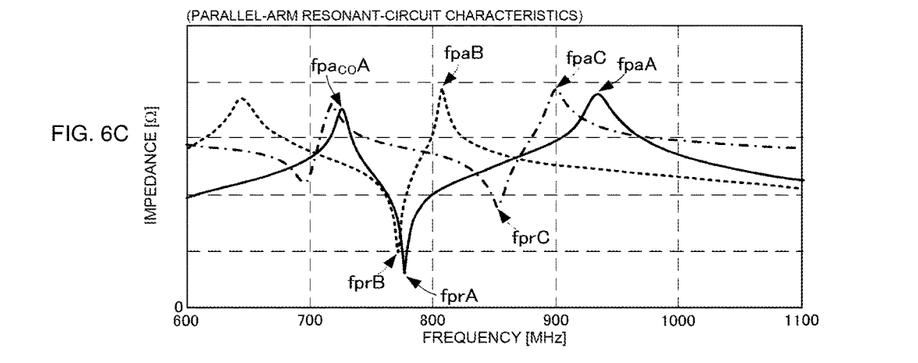

FIGS. 6A-6C are characteristics diagrams of insertion loss and impedance in a first specific example in the case of being utilized for a plurality of communication bands.

In the case where a filter that allows a first communication band to pass therethrough is formed, a pass band $BWpass_A$ is formed by a resonant point fsrA of the series-arm resonant circuit 21 and a sub-anti-resonant point $fpa_{CO}A$ of the parallel-arm resonant circuit 22. An attenuation pole $fap_{LA}$ at a lower frequency is formed by a sub-anti-resonant point $fsa_{CO}A$ of the series-arm resonant circuit 21. Further, an attenuation pole $fap_{HA}$ at a higher frequency is formed by a resonant point fprA of the parallel-arm resonant circuit 22.

In the case where a filter that allows a second communication band to pass therethrough is formed, a pass band $BWpass_B$ is formed by a resonant point fsrB of the series-arm resonant circuit 21 and an anti-resonant point fpaB of the parallel-arm resonant circuit 22. An attenuation pole $fap_{LB}$ at a lower frequency is formed by a resonant point fprB of the parallel-arm resonant circuit 22. Further, an attenuation pole $fap_{HB}$ at a higher frequency is formed by an anti-resonant point fsaB of the series-arm resonant circuit 21.

In the case where a filter that allows a third communication band to pass therethrough is formed, a pass band $BWpass_C$ is formed by a resonant point fsrC of the series-arm resonant circuit 21 and a sub-anti-resonant point fpaC of the parallel-arm resonant circuit 22. An attenuation pole $fap_{LC}$ at a lower frequency is formed by a resonant point fprC of the parallel-arm resonant circuit 22. Further, an attenuation pole $fap_{HC}$ at a higher frequency is formed by an anti-resonant point fsaC of the series-arm resonant circuit 21.

By employing the configuration described above, a band pass filter that allows different frequency bands to be a pass band can be realized. At this time, adjustment to each pass band can be made by only the capacitances of the variable capacitors included in the series-arm resonant circuit 21 and the parallel-arm resonant circuit 22.

By using the sub-anti-resonant point $fpa_{CO}A$ of the parallel-arm resonant circuit 22 and the sub-anti-resonant point $fsa_{CO}A$ of the series-arm resonant circuit 21, the capacitance-variable width required for obtaining desired filter characteristics can be decreased and the filter characteristics having a wider pass band can be realized compared with the case where an anti-resonant point fpaA of the parallel-arm resonant circuit 22 and an anti-resonant point fsaA of the series-arm resonant circuit 21 are used, that is, the case where only a resonant point and an anti-resonant point are used. Since the capacitance-variable width can be decreased, the Q factors of the series-arm resonant circuit 21 and the parallel-arm resonant circuit 22 can be improved and degradation of the insertion loss of the variable-frequency filter 10 can be suppressed.

SECOND EXAMPLE

Figure 7A:
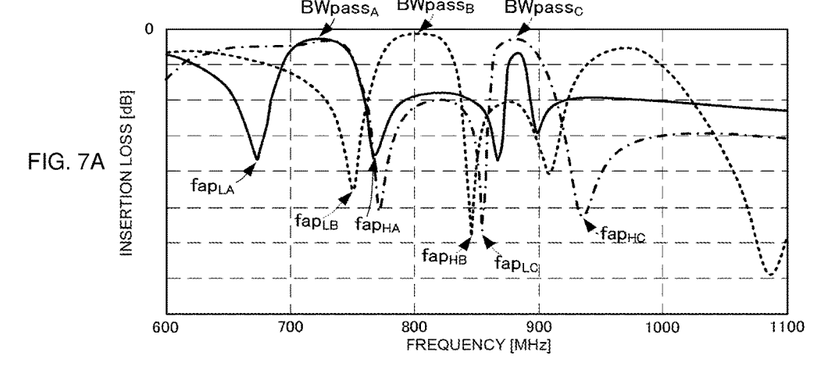
FIGS. 7A-7C are characteristics diagrams of insertion loss and impedance in a second specific example in the case of being utilized for a plurality of communication bands.
Figure 7B:
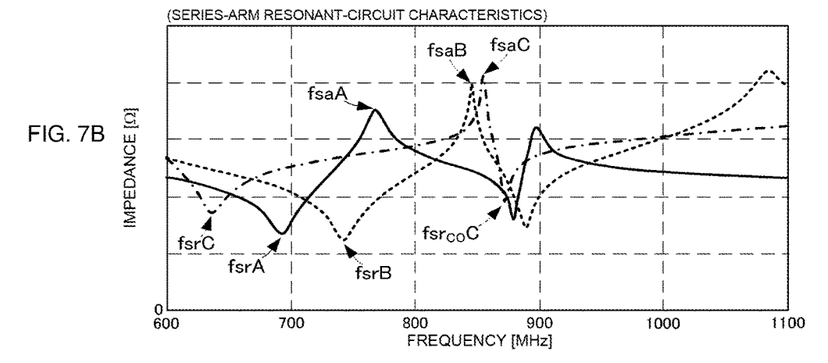
Figure 7C:
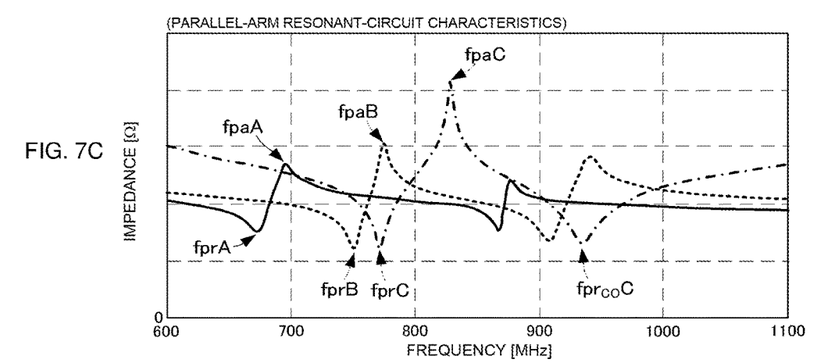

FIGS. 7A-7C are characteristics diagrams of insertion loss and impedance in a second specific example in the case of being utilized for a plurality of communication bands.

In the case where a filter that allows a first communication band to pass therethrough is formed, a pass band $BWpass_A$ is formed by the resonant point fsrA of the series-arm resonant circuit 21 and the anti-resonant point fpaA of the parallel-arm resonant circuit 22. An attenuation pole $fap_{LA}$ at a lower frequency is formed by the resonant point fprA of the parallel-arm resonant circuit 22. Further, the attenuation pole $fap_{HA}$ at a higher frequency is formed by the anti-resonant point fsaA of the series-arm resonant circuit 21.

In the case where a filter that allows a second communication band to pass therethrough is formed, the pass band $BWpass_B$ is formed by the resonant point fsrB of the series-arm resonant circuit 21 and the anti-resonant point fpaB of the parallel-arm resonant circuit 22. The attenuation pole $fap_{LB}$ at a lower frequency is formed by the resonant point fprB of the parallel-arm resonant circuit 22. Further, the attenuation pole $fap_{HB}$ at a higher frequency is formed by the anti-resonant point fsaB of the series-arm resonant circuit 21.

In the case where a filter that allows a third communication band to pass therethrough is formed, the pass band $BWpass_C$ is formed by the sub-resonant point $fsr_{CO}C$ of the series-arm resonant circuit 21 and the sub-anti-resonant point fpaC of the parallel-arm resonant circuit 22. The attenuation pole $fap_{LC}$ at a lower frequency is formed by the anti-resonant point fsaC of the series-arm resonant circuit 21. Further, the attenuation pole $fap_{HC}$ at a higher frequency is formed by a sub-resonant point $fpr_{CO}C$ of the parallel-arm resonant circuit 22.

By employing the configuration described above, a band pass filter that allows different frequency bands to be a pass band can be realized. At this time, adjustment to each pass band can be made by only the capacitances of the variable capacitors included in the series-arm resonant circuit 21 and the parallel-arm resonant circuit 22.

By using the sub-resonant point $fsr_{CO}C$ of the series-arm resonant circuit 21 and the sub-resonant point $fpr_{CO}C$ of the parallel-arm resonant circuit 22, the capacitance-variable width can be made smaller and the filter characteristics having a wider pass band can be realized than in the case where the resonant point fsrC of the series-arm resonant circuit 21 and the resonant point fprC of the parallel-arm resonant circuit 22 are used, that is, the case where only a resonant point and an anti-resonant point are used. Since the capacitance-variable width can be decreased, the Q factors of the series-arm resonant circuit 21 and the parallel-arm resonant circuit 22 can be improved and degradation of the insertion loss of the variable-frequency filter 10 can be suppressed.

THIRD EXAMPLE

Figure 8A:
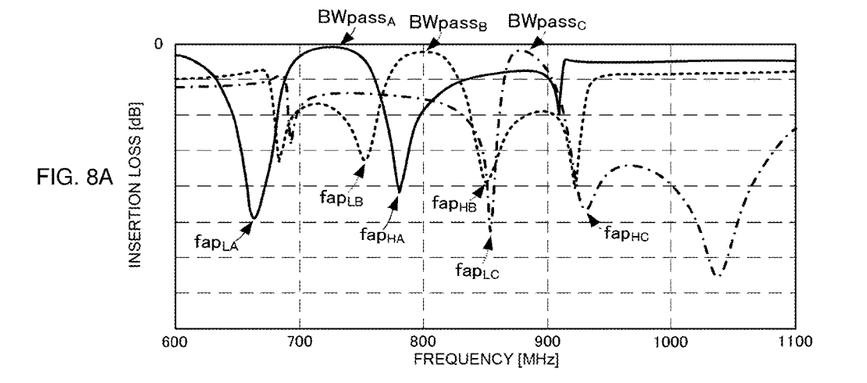
FIGS. 8A-8C are characteristics diagrams of insertion loss and impedance in a third specific example in the case of being utilized for a plurality of communication bands.
Figure 8B:
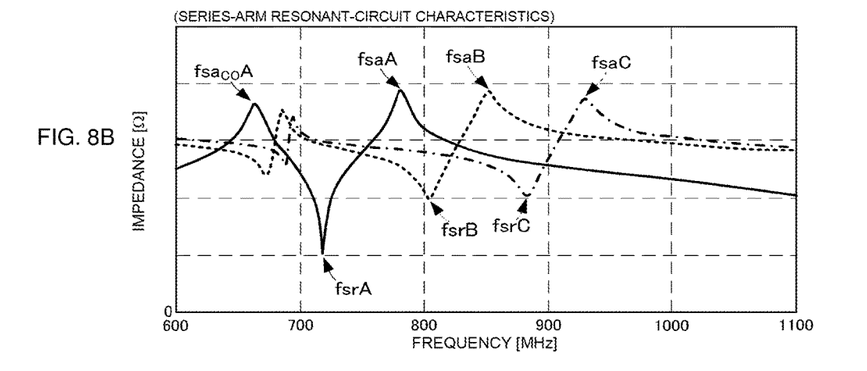
Figure 8C:
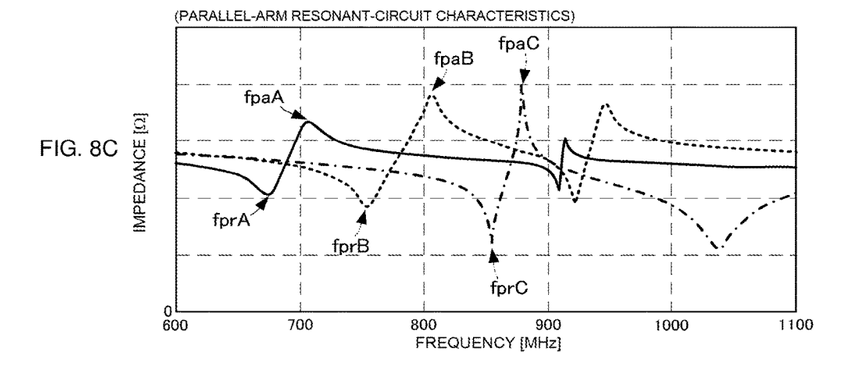

FIGS. 8A-8C are characteristics diagrams of insertion loss and impedance in a third specific example in the case of being utilized for a plurality of communication bands.

In the case where a filter that allows a first communication band to pass therethrough is formed, a pass band $BWpass_A$ is formed by the resonant point fsrA of the series-arm resonant circuit 21 and the anti-resonant point fpaA of the parallel-arm resonant circuit 22. The attenuation pole $fap_{LA}$ at a lower frequency is formed by making the resonant point fprA of the parallel-arm resonant circuit 22 and the sub-anti-resonant point $fsa_{CO}A$ of the series-arm resonant circuit 21 be about the same, the same, or substantially similar. Further, the attenuation pole $fap_{HA}$ at a higher frequency is formed by the anti-resonant point fsaA of the series-arm resonant circuit 21.

In the case where a filter that allows a second communication band to pass therethrough is formed, the pass band $BWpass_B$ is formed by the resonant point fsrB of the series-arm resonant circuit 21 and the anti-resonant point fpaB of the parallel-arm resonant circuit 22. The attenuation pole $fap_{LB}$ at a lower frequency is formed by the resonant point fprB of the parallel-arm resonant circuit 22. Further, the attenuation pole $fap_{HB}$ at a higher frequency is formed by the anti-resonant point fsaB of the series-arm resonant circuit 21.

In the case where a filter that allows a third communication band to pass therethrough is formed, the pass band BWpassC is formed by the resonant point fsrC of the series-arm resonant circuit 21 and the sub-anti-resonant point fpaC of the parallel-arm resonant circuit 22. The attenuation pole $fap_{LC}$ at a lower frequency is formed by the resonant point fprC of the parallel-arm resonant circuit 22. Further, the attenuation pole $fap_{HC}$ at a higher frequency is formed by the anti-resonant point fsaC of the series-arm resonant circuit 21.

By employing the configuration described above, a band pass filter that allows different frequency bands to be a pass band can be realized. At this time, adjustment to each pass band can be made by only the capacitances of the variable capacitors included in the series-arm resonant circuit 21 and the parallel-arm resonant circuit 22.

By using the sub-anti-resonant point $fsa_{CO}A$ of the series-arm resonant circuit 21, the capacitance-variable width can be made smaller and the filter characteristics having a wider pass band can be realized than in the case where only the anti-resonant point fsaA of the series-arm resonant circuit 21 are used, that is, the case where only a resonant point and an anti-resonant point are used. Since the capacitance-variable width can be decreased, the Q factors of the series-arm resonant circuit 21 and the parallel-arm resonant circuit 22 can be improved and degradation of the insertion loss of the variable-frequency filter 10 can be suppressed.

Further, as described in the third example, further versatile bandpass characteristics and attenuation characteristics can be realized by using a combination of an anti-resonant point and a corresponding sub-anti-resonant point. Note that further versatile bandpass characteristics and attenuation characteristics can be similarly realized by a combination of a resonant point and a sub-resonant point.

Figure 9A:
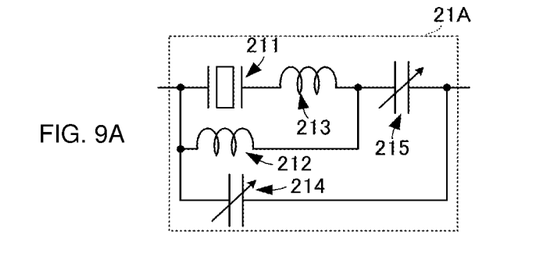
FIGS. 9A-9C are diagrams illustrating example circuit configurations of a resonant circuit according to an embodiment of the present disclosure.
Figure 9B:
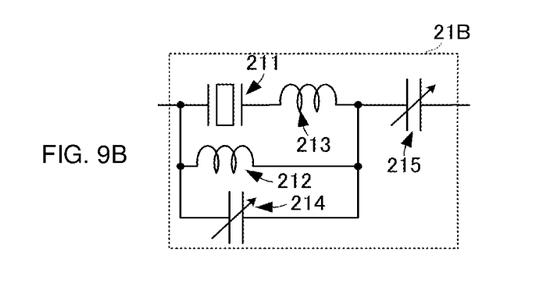
Figure 9C:
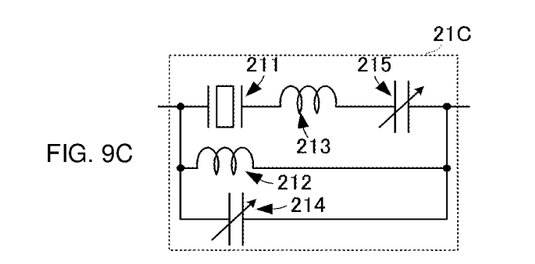

Note that the series-arm resonant circuit 21 and the parallel-arm resonant circuit 22 described above may have the configurations illustrated in FIGS. 9A, 9B, and 9C, not limited to the configurations described above. FIGS. 9A, 9B, and 9C are diagrams illustrating the circuit configurations of the resonant circuit according to an embodiment of the present disclosure. Note that hereinafter, although modifications of the series-arm resonant circuit 21 are illustrated, similar modifications of the parallel-arm resonant circuit 22 may be realized.

In a variable-frequency resonant circuit 21A illustrated in FIG. 9A, the piezoelectric resonator 211, the inductor 213, and the variable capacitor 215 are connected in series with one another. The inductor 212 is connected in parallel with the series circuit of the piezoelectric resonator 211 and the inductor 213. The variable capacitor 214 is connected in parallel with the series circuit of the piezoelectric resonator 211, the inductor 213, and the variable capacitor 215.

In a variable-frequency resonant circuit 21B illustrated in FIG. 9B, the piezoelectric resonator 211, the inductor 213, and the variable capacitor 215 are connected in series with one another. The inductor 212 is connected in parallel with the series circuit of the piezoelectric resonator 211 and the inductor 213. The variable capacitor 214 is connected in parallel with the inductor 212.

In a variable-frequency resonant circuit 21C illustrated in FIG. 9C, the piezoelectric resonator 211, the inductor 213, and the variable capacitor 215 are connected in series with one another. The inductor 212 and the variable capacitor 214 are connected in parallel with the series circuit of the piezoelectric resonator 211, the inductor 213, and the variable capacitor 215.

Note that in the embodiments described above, examples have been described in which a variable-frequency band pass filter supporting a plurality of communication bands is formed. However this can be applied to a variable-frequency low pass filter or a variable-frequency high pass filter supporting a plurality of communication bands.

REFERENCE SIGNS LIST 10 variable-frequency filter
21, 21A, 21B, 21C series-arm resonant circuits
22 parallel-arm resonant circuit
211, 221: piezoelectric resonators
212, 213, 222, 223 inductors (extension inductors)
214, 215, 224, 225 variable capacitors

The invention claimed is:
1. A variable-frequency filter allowing a pass band and an attenuation range to be adjusted, the filter comprising:
a series-arm resonant circuit connected between a first input/output terminal and a second input/output terminal; and
a parallel-arm resonant circuit connected between a ground and a transmission line connecting one of the first input/output terminal and the second input/output terminal to the series-arm resonant circuit,
wherein each of the series-arm resonant circuit and the parallel-arm resonant circuit includes a piezoelectric resonator, an inductor connected to the piezoelectric resonator, and a variable capacitor connected to the piezoelectric resonator, wherein the pass band or attenuation range is adjusted by using at least one of a sub-resonant point or a sub-anti-resonant point of the series-arm resonant circuit, or a sub-resonant point or a sub-anti-resonant point of the parallel-arm resonant circuit, wherein the inductor of the parallel-arm resonant circuit is connected in parallel with the piezoelectric resonator of the parallel-arm resonant circuit, and generates sub-anti-resonance at a lower frequency than a resonant point of the parallel-arm resonant circuit, and wherein the pass band is set by using the sub-anti-resonant point of the parallel-arm resonant circuit.

2. The variable-frequency filter according to claim 1, wherein values of the variable capacitors of the parallel-arm resonant circuit and the series-arm resonant circuit are such that the frequency of the resonant point of the parallel-arm resonant circuit and the frequency of an anti-resonant point of the series-arm resonant circuit are closer to each other than the frequency of a resonant point of the series-arm resonant circuit and the frequency of the sub-anti-resonant point of the parallel-arm resonant circuit.

3. The variable-frequency filter according to claim 1, wherein the inductor of the series-arm resonant circuit is connected in parallel with the piezoelectric resonator of the series-arm resonant circuit and generates sub-anti-resonance at a lower frequency than a resonant point of the series-arm resonant circuit, and wherein the attenuation range is set by using a sub-anti-resonant point of the series-arm resonant circuit.

4. The variable-frequency filter according to claim 3, wherein values of the variable capacitors of the parallel-arm resonant circuit and the series-arm resonant circuit are such that the frequency of a resonant point of the parallel-arm resonant circuit and the sub-anti-resonant point of the series-arm resonant circuit are closer to each other than the frequency of the resonant point of the series-arm resonant circuit and the frequency of the anti-resonant point of the parallel-arm resonant circuit.

5. The variable-frequency filter according to claim 1, wherein the parallel-arm resonant circuit further includes a second inductor connected in series with the piezoelectric resonator of the parallel-arm resonant circuit, wherein the second inductor generates sub-resonance at a higher frequency than an anti-resonant point of the parallel-arm resonant circuit, and wherein the attenuation range is set by using the sub-resonant point of the parallel-arm resonant circuit.

6. The variable-frequency filter according to claim 5, wherein values of the variable capacitors of the parallel-arm resonant circuit and the series-arm resonant circuit are such that a resonant point of the series-arm resonant circuit and the anti-resonant point of the parallel-arm resonant circuit are the same or substantially similar, and wherein the attenuation range at higher frequencies than the pass band is set by using the sub-resonant point of the parallel-arm resonant circuit.

7. The variable-frequency filter according to claim 1, wherein the series-arm resonant circuit further comprises a second inductor and a second variable capacitor, the second inductor and the second variable capacitor being connected in parallel with each other.

8. The variable-frequency filter according to claim 7, wherein one of the inductor and the second inductor of the series-arm resonant circuit is connected in parallel with the piezoelectric resonator of the series-arm circuit and the other of the inductor and the second inductor of the series-arm resonant circuit is connected in series with the piezoelectric resonator of the series-arm circuit.

9. The variable-frequency filter according to claim 7, wherein one of the variable capacitor and the second variable capacitor of the series-arm resonant circuit is connected in parallel with the piezoelectric resonator of the series-arm circuit and the other of the inductor and the second inductor of the series-arm resonant circuit is connected in series with the piezoelectric resonator of the series-arm circuit.

10. The variable-frequency filter according to claim 1, wherein
the piezoelectric resonator of the series-arm resonant circuit is a surface acoustic wave (SAW) resonator or bilk acoustic wave (BAW) resonator, and
the piezoelectric resonator of the parallel-arm resonant circuit is a SAW resonator or a BAW resonator.

11. A variable-frequency filter allowing a pass band and an attenuation range to be adjusted, the filter comprising:
a series-arm resonant circuit connected between a first input/output terminal and a second input/output terminal; and
a parallel-arm resonant circuit connected between a ground and a transmission line connecting one of the first input/output terminal and the second input/output terminal to the series-arm resonant circuit,
wherein each of the series-arm resonant circuit and the parallel-arm resonant circuit includes a piezoelectric resonator, an inductor connected to the piezoelectric resonator, and a variable capacitor connected to the piezoelectric resonator, and
wherein the pass band or attenuation range is adjusted by using at least one of a sub-resonant point or a sub-anti-resonant point of the series-arm resonant circuit, or a sub-resonant point or a sub-anti-resonant point of the parallel-arm resonant circuit,
wherein the inductor of the series-arm resonant circuit is connected in series with the piezoelectric resonator of the series-arm resonant circuit and generates sub-resonance at a higher frequency than an anti-resonant point of the series-arm resonant circuit, and
wherein the pass band is set by using the sub-resonant point of the series-arm resonant circuit.

12. The variable-frequency filter according to claim 11, wherein values of the variable capacitors of the parallel-arm resonant circuit and the series-arm resonant circuit are such that the frequency of a resonant point of the parallel-arm resonant circuit and the frequency of the anti-resonant point of the series-arm resonant circuit are closer to each other than the frequency of the sub-resonant point of the series-arm resonant circuit and the frequency of the anti-resonant point of the parallel-arm resonant circuit.

* * * * *